(12) United States Patent
Russell et al.

(10) Patent No.: US 7,492,627 B2
(45) Date of Patent: Feb. 17, 2009

(54) MEMORY WITH INCREASED WRITE MARGIN BITCELLS

(75) Inventors: Andrew C. Russell, Austin, TX (US); Prashant U. Kenkare, Austin, TX (US); Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 160 days.

(21) Appl. No.: 11/561,255

(22) Filed: Nov. 17, 2006

(65) Prior Publication Data

US 2008/0117666 A1    May 22, 2008

(51) Int. Cl.
*G11C 11/00* (2006.01)
(52) U.S. Cl. .................. 365/154; 365/226; 365/156
(58) Field of Classification Search .......... 365/154, 365/226, 156
See application file for complete search history.

(56) References Cited

U.S. PATENT DOCUMENTS

| 5,689,458 | A | * | 11/1997 | Kuriyama | 365/159 |
|---|---|---|---|---|---|
| 6,597,620 | B1 | | 7/2003 | McMinn | |
| 6,724,648 | B2 | * | 4/2004 | Khellah et al. | 365/154 |
| 7,289,354 | B2 | * | 10/2007 | Houston | 365/154 |
| 2004/0125644 | A1 | * | 7/2004 | Komatsuzaki | 365/154 |
| 2004/0130930 | A1 | | 7/2004 | Houston | |
| 2006/0056229 | A1 | | 3/2006 | Maeda et al. | |
| 2007/0165448 | A1 | * | 7/2007 | Itoh et al. | 365/154 |

* cited by examiner

*Primary Examiner*—Connie C Yoha

(57) ABSTRACT

A memory comprising a first bit line, a second bit line, a word line, a first pair of cross-coupled inverters having a first input/output node and a second input/output node, a first power supply node and a second power supply node, wherein the first power supply node is coupled to a first power supply terminal, is provided. The memory further comprises a first gating transistor coupled between a second power supply terminal and the second power supply node, the first gating transistor receiving a first write enable signal that gates the gating transistor to a non-conductive condition during a write of the first pair of cross-coupled inverters. The memory further comprises a first pass transistor coupled to the first word line, the first input/output node, and the first bit line and a second pass transistor coupled to the first word line, the second input/output node, and the second bit line.

25 Claims, 7 Drawing Sheets

MEMORY WITH INCREASED WRITE MARGIN BITCELLS

BACKGROUND OF THE INVENTION

1. Field of the Invention

This invention relates in general to memories and more specifically to a memory with increased write margin bitcells.

2. Description of the Related Art

Increasingly, newer generations of memories are using a lower supply voltage to reduce power consumption. The lower supply voltage when used to write a memory, however, degrades the performance of memory bitcells. By way of example, the lower supply voltage results in a lower write margin for the bitcells.

Conventionally, to maintain the write margin during a write operation, circuit designers have been forced to use a higher supply voltage. In other words, the minimum supply voltage required by the bitcell to have an acceptable write margin becomes the supply voltage for the memory resulting in higher power consumption.

A lower supply voltage can be used for the memory if the bitcell write margin can be improved. Thus, there is a need for a memory with an increased write margin bitcells.

BRIEF DESCRIPTION OF THE DRAWINGS

The present invention may be better understood, and its numerous objects, features, and advantages made apparent to those skilled in the art by referencing the accompanying drawings.

Skilled artisans would appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a memory comprising a first bit line, a second bit line, and a word line is provided. The memory further comprises a first pair of cross-coupled inverters having a first input/output node and a second input/output node, a first power supply node and a second power supply node, wherein the first power supply node is coupled to a first power supply terminal. The memory further comprises a first gating transistor coupled between a second power supply terminal and the second power supply node, the first gating transistor receiving a first write enable signal that gates the gating transistor to a non-conductive condition during a write of the first pair of cross-coupled inverters. The memory further comprises a first pass transistor coupled to the first word line, the first input/output node, and the first bit line. The memory further comprises a second pass transistor coupled to the first word line, the second input/output node, and the second bit line.

In another aspect, a method in a memory comprising a first pair of cross-coupled inverters, a first pair of bit lines, a first pair of pass gates coupled between the first pair of bit lines and the first pair of cross-coupled inverters, and a first word line coupled to the first pair of pass gates is provided. The method comprises applying a power supply voltage to the first pair of cross-coupled inverters to retain data in the first pair of cross-coupled inverters. The method further comprises enabling the first word line during writing of the first pair of cross-coupled inverters. The method further comprises applying data to the first pair of bit lines during writing of the first pair of cross-coupled inverters. The method further comprises decoupling the power supply voltage from the first pair of cross-coupled inverters during writing of the first pair of cross-coupled inverters.

In yet another aspect, a memory comprising a word line and a plurality of memory cells coupled to the word line is provided. The memory further comprises a plurality of pairs of bit lines, wherein each memory cell of the plurality of memory cells is coupled to a different pair of bit lines of the plurality of bit lines. The memory further comprises power means for coupling power to the memory cells for retaining states of the memory cells and decoupling power from the plurality of memory cells during a write of the plurality of memory cells.

Figure 1:
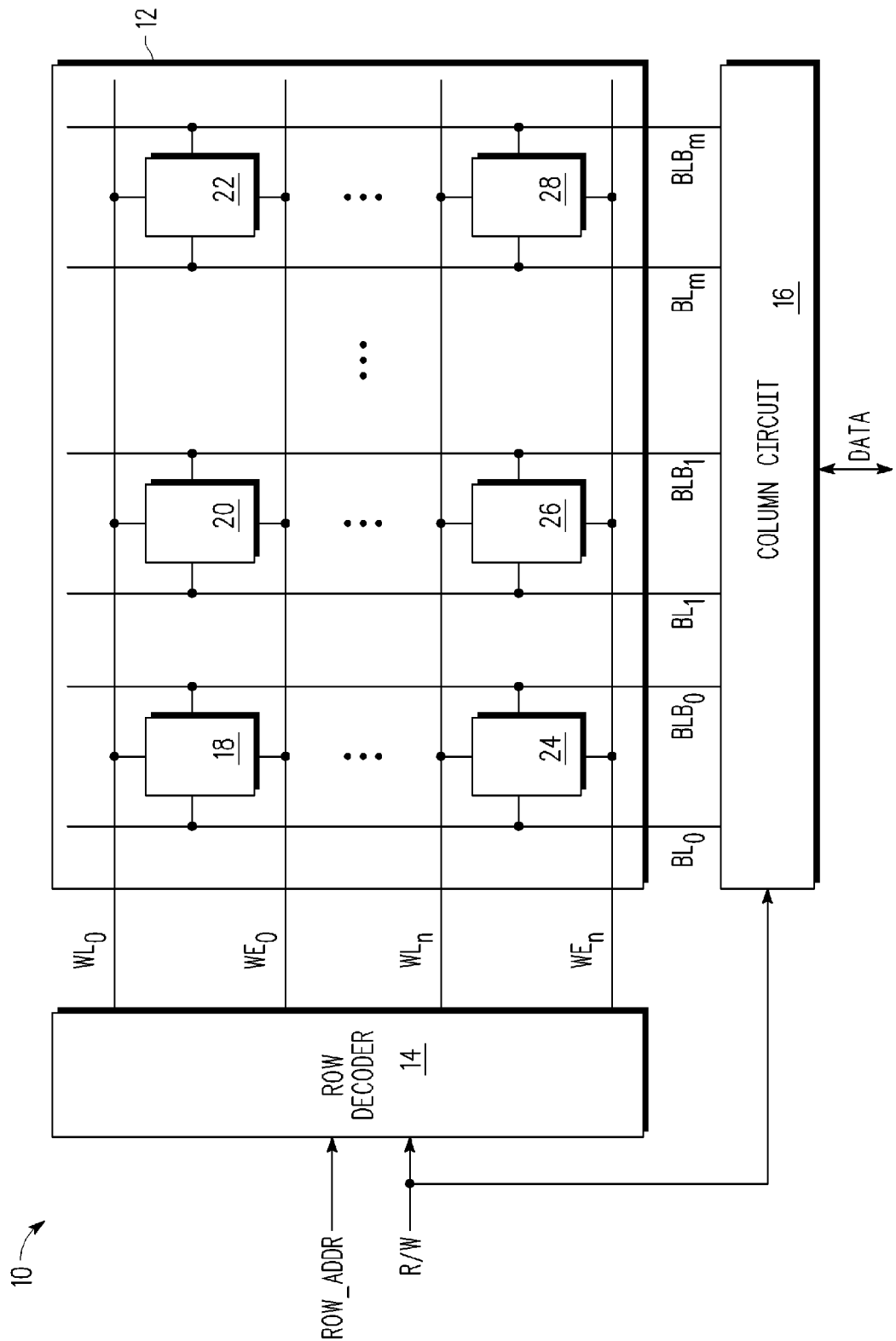
FIG. 1 shows a diagram of an exemplary memory.

Referring now to FIG. 1, it shows a diagram of an exemplary memory 10. Memory 10 may be implemented as a cache. Memory 10 may also be implemented as a stand-alone memory, such as a static-RAM. Although not shown, memory 10 may be included in an integrated circuit, which may include a CPU. Memory 10 may include a bitcell array 12. Each bitcell of bitcell array 12 may have a write margin and a read margin. By way of example, the bitcells may be static random access memory cells. Memory 10 may further include a row decoder 14, and a column circuit 16. Row decoder 14 and column circuit 16 may be used to read/write data from/to bitcells, such as bitcell 18 of bitcell array 12. Row decoder 14 may receive a row address (ROW_ADDR) signal from another device, a CPU, for example. Column circuit 16 may receive various signals, such as column address (COL_ADDR) signal (not shown), read/write (R/W) signal, and column select (COL_SEL) signal (not shown). Row decoder 14 and column circuit 16 may receive additional signals. Column circuit 16 may provide data and/or receive data (DATA) from a processor, for example. Bitcell 18 and other similar bitcells (20, 22, 24, 26, and 28, for example) of bitcell array 12 may be accessed using word lines $WL_0$-$WL_n$, bit lines $BL_0$-$BL_m$ and $BLB_0$-$BLB_m$, and write enables $WE_0$-$WE_n$. By way of example, bitcells 18, 20, 22, 24, 26, and 28 may be organized in rows and columns as part of memory array 12. Each column of bitcells may be coupled to column circuit 16.

Figure 2:
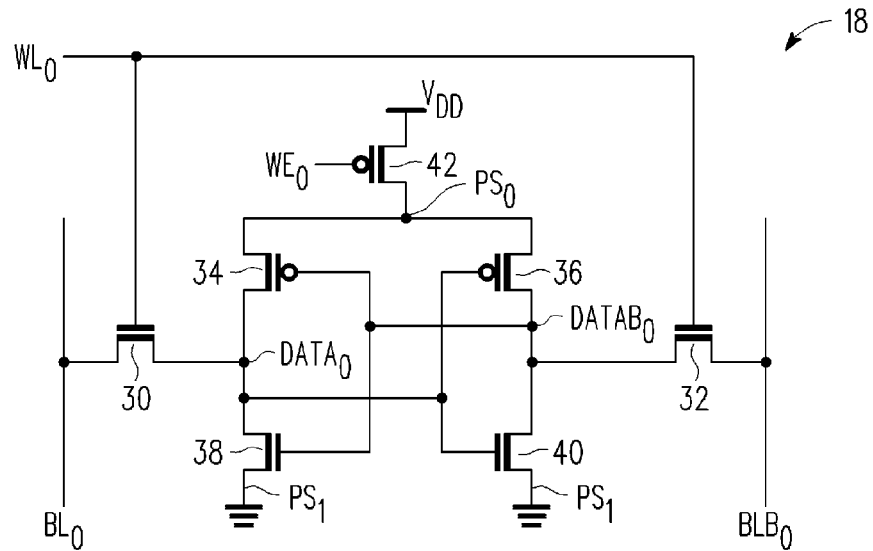
FIG. 2 shows a diagram of an exemplary implementation of a bitcell of the memory shown in FIG. 1.

FIG. 2 shows a diagram of an exemplary implementation of a bitcell 18 of bitcell array 12 shown in FIG. 1. Exemplary bitcell 18 may be implemented as a seven transistor cell. By way of example, bitcell 18 may include a pass transistor 30 (n-MOS transistor, for example) with one of its current terminals coupled to the bit line $BL_0$ and its control terminal coupled to the word line $WL_0$. Bitcell 18 may further include another pass transistor 32 (n-MOS transistor, for example) with one of its current terminals coupled to the bit line $BLB_0$ and its control terminal coupled to the word line $WL_0$. Bitcell 18 may further include a pull up transistor 34 (p-MOS transistor, for example) with one of its current terminals coupled to (with an interposed gating transistor 42) the $V_{DD}$ voltage terminal. For example, as shown in FIG. 2, one current terminal of gating transistor 42 may be coupled to a current terminal of pull-up transistor 34 and the other current terminal of gating transistor 42 may be coupled to the $V_{DD}$ voltage terminal. Although FIG. 2 shows a p-MOS transistor as the gating transistor 42, an n-MOS transistor could also be used. Bitcell 18 may further include another pull up transistor 36 (p-MOS transistor, for example) with one of its current terminals coupled to, with an interposed gating transistor 42, the $V_{DD}$ voltage terminal. Bitcell 18 may further include a pull down transistor 38 (n-MOS transistor, for example) with one of its current terminals coupled to a ground voltage terminal. Bitcell 18 may further include another pull down transistor 40 (n-MOS transistor, for example) with one of its current terminals coupled to the ground voltage terminal. Although FIG. 3 shows bitcell 18 implemented using seven transistors, bitcell 18 may be implemented using more transistors, for example, using eight or nine transistors.

Thus, consistent with FIG. 2, an exemplary memory comprising a first bit line ($BL_0$), a second bit line ($BLB_0$), and a word line ($WL_0$) is provided. The memory further comprises a first pair of cross-coupled inverters (formed using transistors 34, 38 and 36, and 40, respectively) having a first input/output node ($DATA_0$) and a second input/output node ($DATAB_0$), a first power supply node ($PS_1$) and a second power supply node ($PS_0$), wherein the first power supply node is coupled to a first power supply terminal. The memory further comprises a first gating transistor (42, for example) coupled between a second power supply terminal (voltage supply terminal $V_{DD}$) and the second power supply node ($PS_0$), the first gating transistor receiving a first write enable signal ($WE_0$) that gates the gating transistor to a non-conductive condition during a write of the first pair of cross-coupled inverters. The memory further comprises a first pass transistor (30) coupled to the first word line ($WL_0$), the first input/output node, and the first bit line ($BL_0$). The memory further comprises a second pass transistor (32) coupled to the first word line ($WL_0$), the second input/output node, and the second bit line ($BLB_0$). In one embodiment, all bitcells in a row are written since all bitcells on a row share the same write enable. In another embodiment, a row may have two write enables where the first write enable goes to half the bitcells in the row and the second write enable goes to the other half of bitcells in the row. In this configuration half the bitcells on a row could be written while the other half could retain state.

Figure 3:
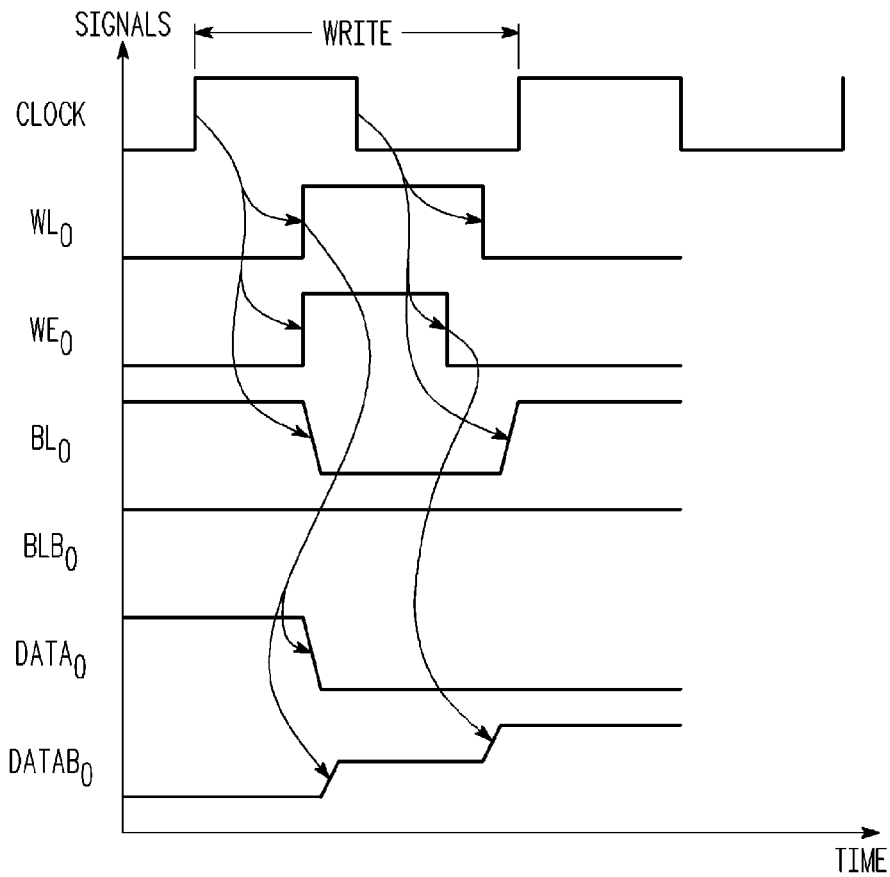
FIG. 3 shows an exemplary timing diagram for a write operation of the bitcell of FIG. 2.

FIG. 3 shows an exemplary timing diagram (voltage versus time) for a write operation of the bitcell of FIG. 2. As part of operation of bitcell 18, by way of example, a half cycle of clock (CLOCK) may be used to assert word line signal $WL_0$ to perform the write operation. $WE_0$ signal may be asserted at the same time as the word line signal by row decoder 14, for example. Bit line signal $BL_0$ may be pulled down, while $BLB_0$ may remain high. This way data may be written to the bitcell as reflected in the transition of the voltages at $DATA_0$ node and the $DATAB_0$ node. Consistent with the exemplary implementation of bitcell 18 shown in FIG. 2, the bitcell write margin is improved because the p-MOS pull-up transistors (34 and 36 of FIG. 2) are disconnected from the $V_{DD}$ voltage terminal during the write operation. In particular, as shown in FIG. 3, when word line signal is asserted the write enable $VE_0$ signal is also asserted, which turns-off gating transistor 42. This makes it easier to write a logic zero into the bitcell. The write enable $WE_0$ signal may be generated by performing a logic AND operation on the $WL_0$ signal and a global WE signal generated using a signal generator consisting of delay elements. The signal generator may be incorporated as part of read decoder 14. Once internal bitcell node ($DATA_0$ node) is pulled low, gating transistor 42 is turned back on. Thus, pull-up transistors 34 and 36 may be used to restore a logic one value to $DATAB_0$ node. Although FIG. 3 shows a specific timing sequence, the bitcell could be operated using other timing sequences as well. De-asserting the $WE_0$ signal before de-asserting the $WL_0$ signal allows the internal bitcell node to be substantially restored to a logic one value before $WL_0$ is disabled.

Thus, consistent with the operation of bitcell 18 explained above with respect to FIG. 3, a power supply voltage to the first pair of cross-coupled inverters may be applied to retain data in the first pair of cross-coupled inverters. Next, the first word line may be enabled during writing of the first pair of cross-coupled inverters. Next, data may be applied to the first pair of bit lines during writing of the first pair of cross-coupled inverters. Finally, the power supply voltage may be decoupled from the first pair of cross-coupled inverters during writing of the first pair of cross-coupled inverters.

Since bitcell 18 may be decoupled from the $V_{DD}$ voltage terminal depending on whether bitcell 18 is being written to or being read from, the conductance of transistors comprising bitcell 18 can also be adjusted to achieve better performance. By way of example, the conductance of pass transistor 30 $\beta_{PG}$ may be set up relative to the conductance of pull up transistor 34 $\beta_{PU}$. Similarly, a conductance ratio $\beta_{PG}/\beta_{PU}$ corresponding to pass transistor 32 and pull up transistor 36 may also be configured appropriately. Conductance of other transistors, such as $\beta_{PD}$ of pull down transistors 38 and 40 may be adjusted, if necessary. The conductance values of the transistors may be set in other ways to achieve other benefits. By way of example, by setting the conductance values of the transistors, in some cases the read margin of the memory cells may be made substantially greater than the write margin. As described earlier, gating transistor 42 is turned off during write operations making it easier to write a logic zero into the cell. This further allows more flexibility in adjusting the conductance of transistors 34 and 36 to increase read margin. For example, the read margin could be made such that it is at least 20% greater than in the case where the write and read margins are balanced. This could be achieved by setting a conductance ratio of the memory cell access transistors relative to the memory cell pull-up transistors. Alternatively, in some instances, the write margin of the memory cells may be made substantially greater than the read margin.

Figure 4:
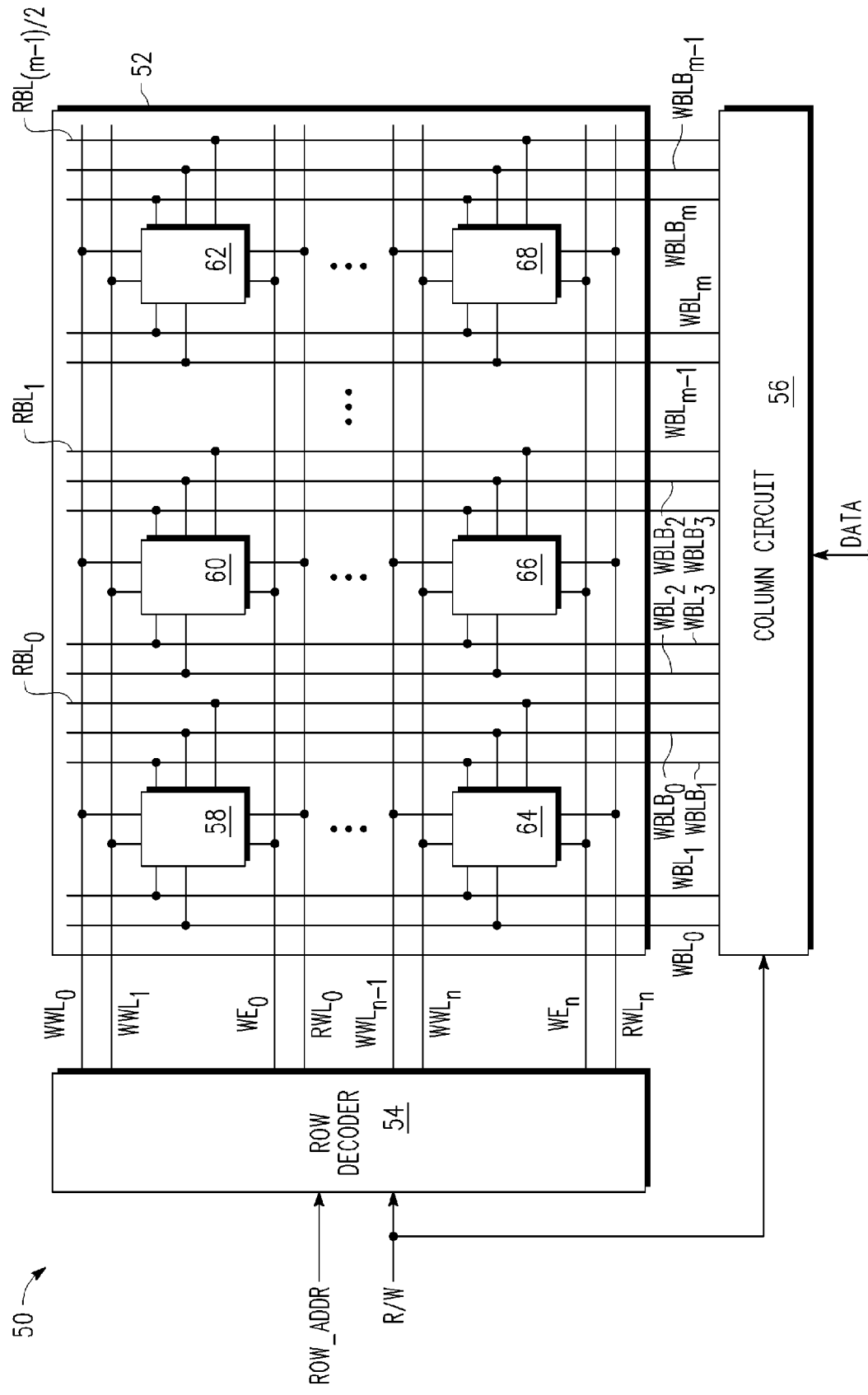
FIG. 4 shows another exemplary memory.

FIG. 4 shows another exemplary memory 50. Like memory 10 of FIG. 1, memory 50 may include a bitcell array 52. Each bitcell of bitcell array 52 may have a write margin and a read margin. Memory 50 may further include a row decoder 54, and a column circuit 56. Row decoder 54 and column circuit 56 may be used to read/write data from/to bitcells, such as bitcells 58, 60, 62, 64, 66, and 68 of bitcell array 52 in a similar manner as described above with respect to memory 10 shown in FIG. 1. Bitcells 58, 60, 62, 64, 66, and 68 may be implemented in a similar manner, as described above with respect to FIG. 2. Moreover, they may have similar operation and timing characteristics as illustrated with respect to FIG. 3.

Figure 5:
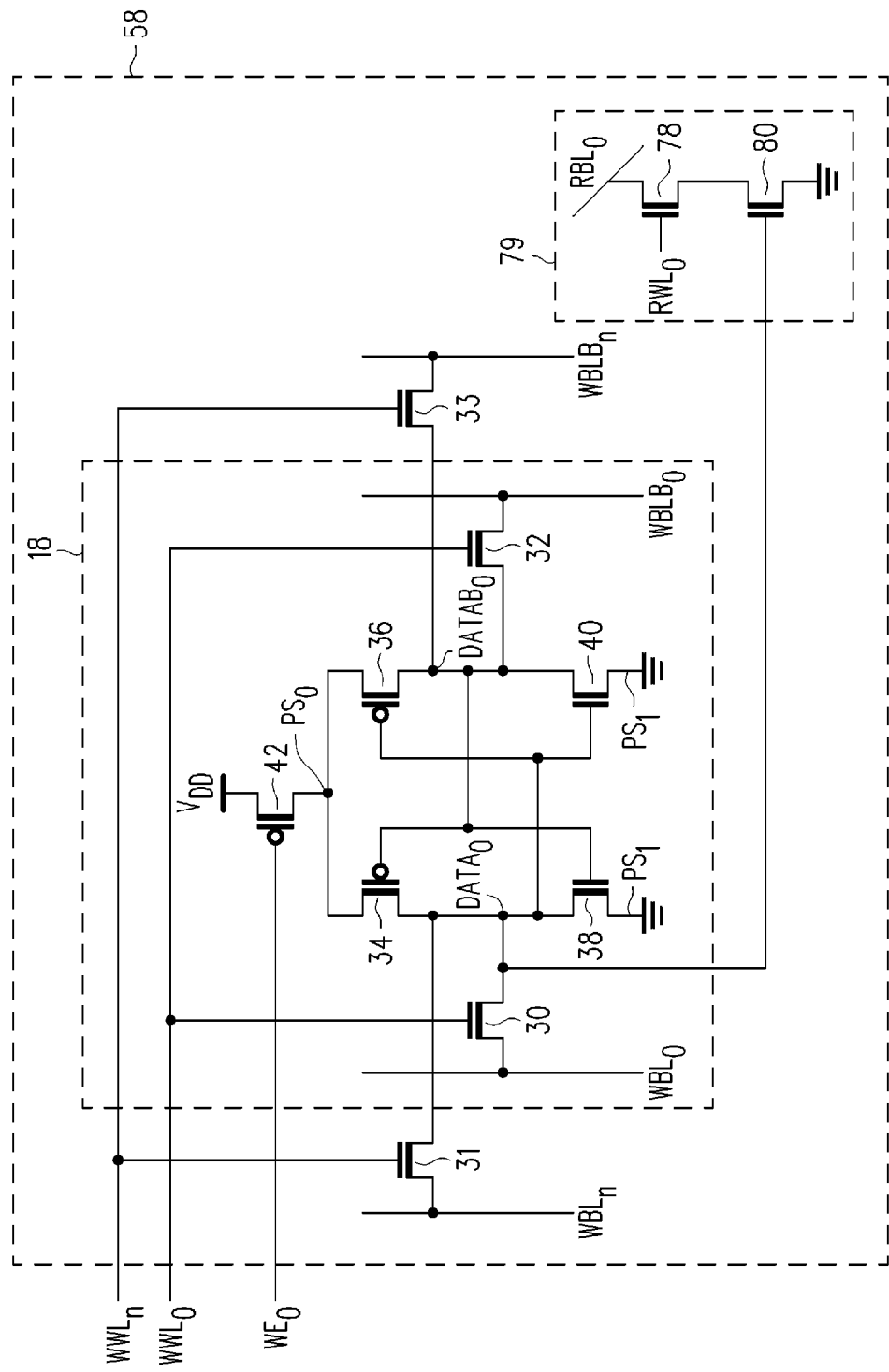
FIG. 5 shows an exemplary multi-port bitcell for the exemplary memory of FIG. 4.

FIG. 5 shows an exemplary multi-port bitcell 58 with two write ports and one read port, configured for use as a multi-port bitcell for the exemplary memory of FIG. 4. By way of example, bitcell 18 described with reference to FIG. 2 may be configured as a multi-port bitcell by adding pass transistors 31 and 33 and read port 79. First pass transistor 30 is coupled to the first write wordline (WWL$_0$), the first input/output node (DATA$_0$), and the first write bitline (WBL$_0$). Second pass transistor 32 is coupled to the first write wordline (WWL$_0$), the second input/output node (DATAB$_0$), and the second write bitline (WBLB$_0$). Third pass transistor 31 is coupled to the second write wordline (WWL$_1$), the first input/output node (DATA$_0$), and the third write bitline (WBL$_1$). Fourth pass transistor 33 is coupled to the second write wordline (WWL$_1$), the second input/output node (DATAB$_0$), and the fourth write bitline (WBLB$_1$). Pass transistors 30 and 32 constitute write port 0 and pass transistors 31 and 33 constitute write port 1. Read port 79 consists of n-MOS transistors 78 and 80 coupled in series. Transistor 78 is coupled to the first read word line (RWL$_0$), the first read bitline (RBL$_0$), and the source of transistor 80. Transistor 80 is coupled to DATA$_0$, the drain of transistor 78, and the ground voltage terminal. Although bitcell 58 is configured with two write ports and one read port, additional write and read ports may be added. In another embodiment, bitcell 58 may have one write port and one read port and the write enable signal may be coupled to the write wordline. In this configuration, since the WE$_0$ signal is tied to the WWL$_0$ signal, the restore of the internal bitcell node to a logic high value is delayed until after the fall of WWL$_0$ signal to a logic zero value.

During a write operation of multi-port bitcell 58, when either write word line 0 or word line 1 is asserted, the write enable WE$_0$ signal is also asserted, which turns-off gating transistor 42 thereby disconnecting multi-port bitcell 58 from voltage supply V$_{DD}$. This makes it easier to write a logic zero into the bitcell. The write enable WE$_0$ signal may be generated by first performing a logic OR operation WWL$_0$ and WWL$_1$ and then performing a logic AND operation on the result and a global WE signal from a signal generator. The signal generator may consist of delay elements and may be incorporated as part of row decoder 54. During the write operation, the read wordline (RWL$_0$) remains de-asserted.

During a read operation of multi-port bitcell 58, the read wordline (RWL$_0$) is asserted and WWL$_0$, WWL$_1$, and WE$_0$ remain de-asserted. If the DATA$_0$ node is a logic zero when RWL$_0$ is asserted, the read bitline (RBL$_0$) will remain at the precharge value of a logic one. If the DATA$_0$ node is a logic one when RWL$_0$ is asserted, the RBL$_0$ will be discharged to a logic zero. RBL$_0$ will be precharged back to a logic 1 during the precharge phase.

Figure 6:
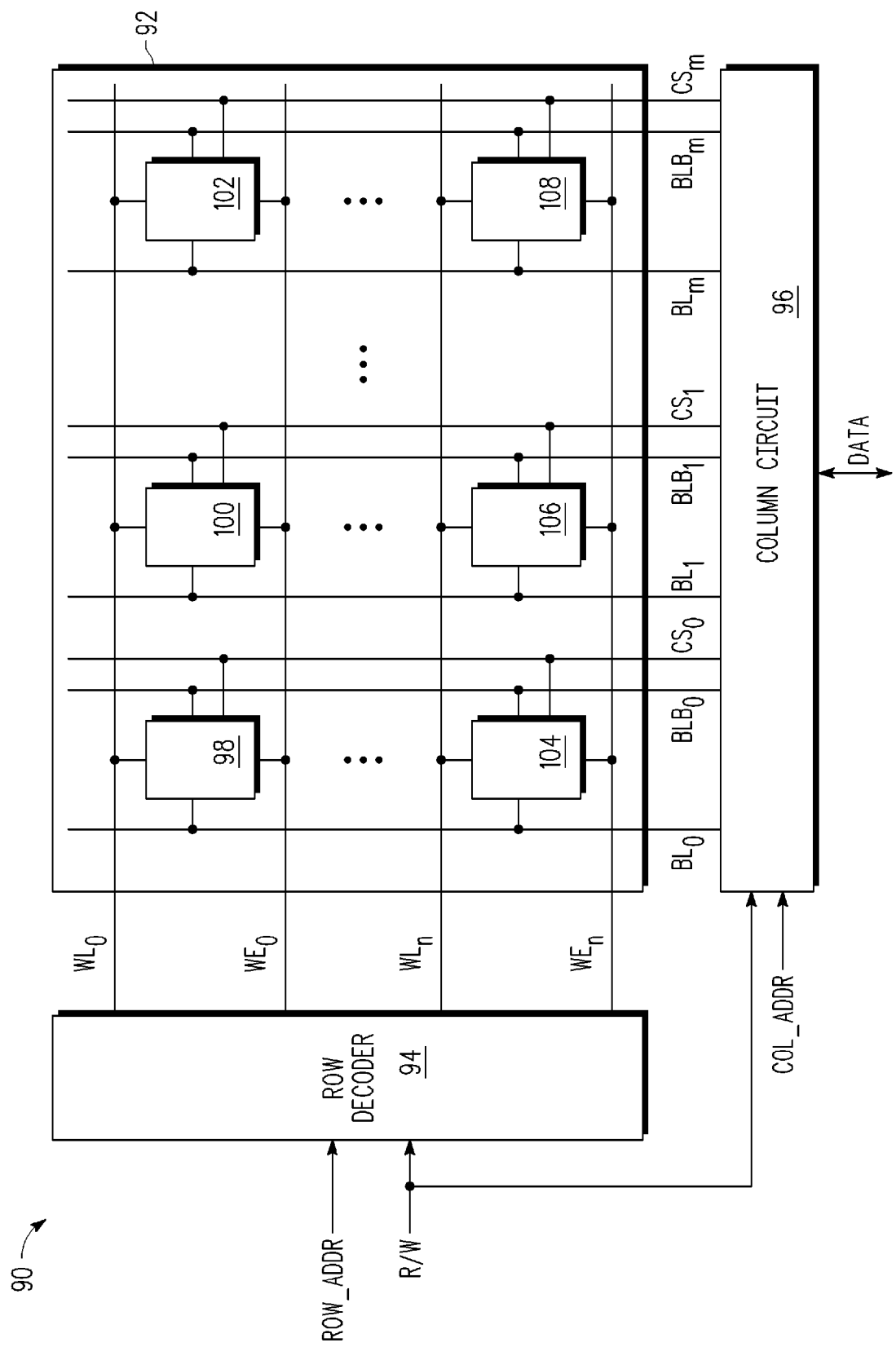
FIG. 6 shows another exemplary memory.

FIG. 6 shows another exemplary memory 90. Like memory 10 of FIG. 1, memory 90 may include a bitcell array 92. Each bitcell of bitcell array 92 may have a write margin and a read margin. Memory 90 may further include a row decoder 94, and a column circuit 96. Row decoder 94 and column circuit 96 may be used to read/write data from/to bitcells, such as bitcells 98, 100, 102, 104, 106, and 108 of bitcell array 92.

Figure 7:
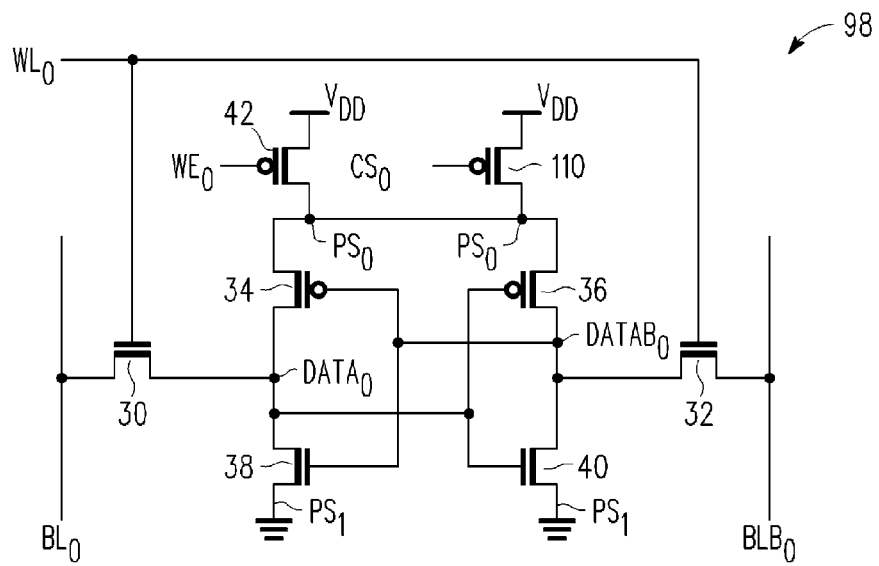
FIG. 7 shows a diagram of an exemplary implementation of a bitcell for the memory of FIG. 6.

FIG. 7 shows a diagram of an exemplary implementation of a bitcell for the memory of FIG. 6. In addition to the seven transistors shown as part of exemplary bitcell 18, exemplary bitcell 98 may include an eighth transistor 110. A column select signal (CS$_0$) may be coupled to a control electrode of transistor 110, such that this signal may act as a column select signal. The addition of a column select signal allows bitcells on the same row to be selectively written. For example, the column select signal could enable individual bit write-ability on a row, or by way of another example, it could enable every 4$^{th}$ bit on a row to be written. During a write operation, the WE signal on the row on which bitcells are to be written will be asserted. Bitcells to be written will have both their WE and CS signal asserted thus disconnecting the bitcell from the V$_{DD}$ supply, making the bitcell easier to write. Those bitcells on the same row that are not to be written will have the WE asserted but the CS will remain de-asserted thus preserving the state of the bitcell. Additionally, the bitlines of bitcells not to be written will be precharged high preserving the state of bitcells since their pass gates will be in a conductive state due to the asserted wordline. The individual column select signals, such as CS$_0$, can be generated from a decoded column address or individual bit write enables. The timing of individual column select signals may be controlled by a global CS signal generated by a global CS signal generator. The global CS signal may be ANDed with the decoded column select signal to create an individual column select, such as CS$_0$. The global CS signal generator may consist of delay elements to adjust the timing of the global CS signal and may be incorporated as part of column circuit 96. In one embodiment, there may be a global WE signal generator incorporated as part of row decoder 94 and a global CS signal generator incorporated as part of column circuit 96. In another embodiment, the global WE signal and the global CS signal may share the same signal generator.

Although FIG. 7 shows a specific implementation for coupling a column select signal (CS$_0$) as part of exemplary bitcell 98, other implementations may also be used consistent with the disclosed embodiments. Exemplary bitcell 98 may also be configured to have a read port and a write port or to have multiple read and write ports.

Figure 8:
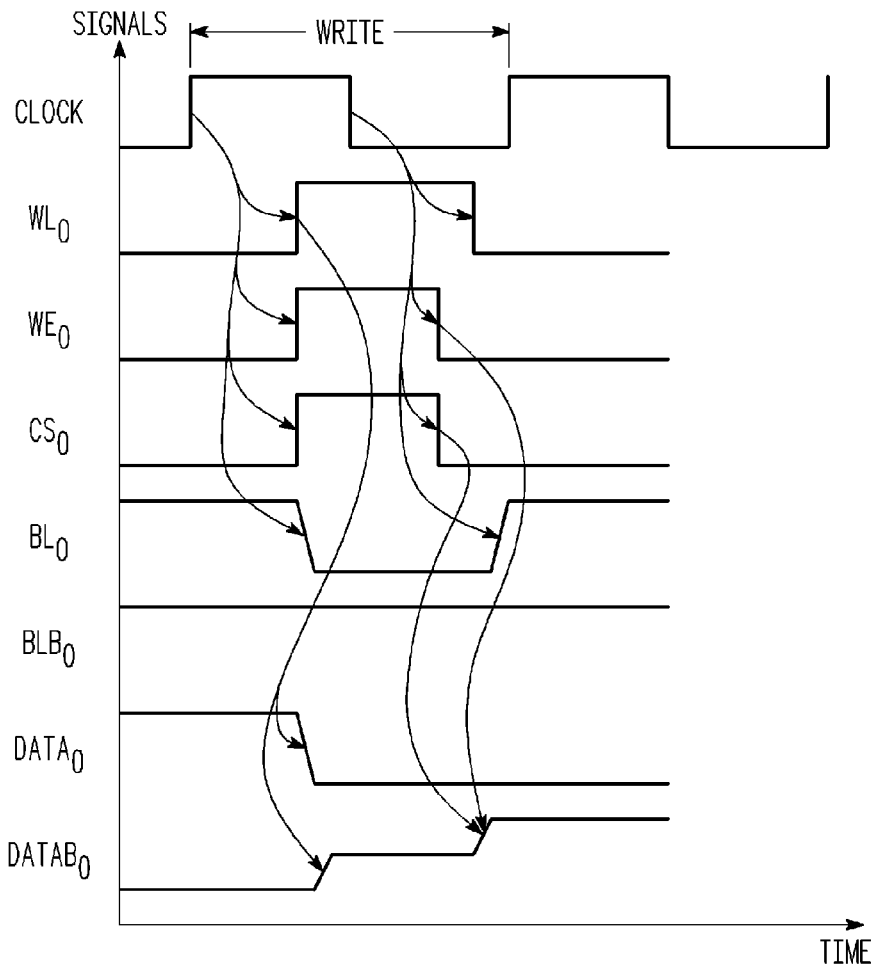
FIG. 8 shows an exemplary timing diagram for a write operation of the bitcell of FIG. 7.

FIG. 8 shows an exemplary timing diagram for a write operation of the bitcell of FIG. 7. As explained above with respect to FIG. 7, exemplary bitcell 98 is an eight transistor version of the seven transistor implementation shown in FIG. 2. Thus, in terms of its operation, bitcell 98 may operate in a substantially similar manner to bitcell 18. As part of operation of bitcell 98, by way of example, a half cycle of clock (CLOCK) may be used to assert word line signal WL$_0$ to perform the write operation. WE$_0$ signal may be asserted at the same time as the word line signal by row decoder 94, for example. Moreover, as part of the write operation column select signal (CS$_0$) signal may also be asserted. Bit line signal BL$_0$ may be pulled down, while BLB$_0$ may remain high. This way data may be written to the bitcell as reflected in the transition of the voltages at DATA$_0$ node and the DATAB$_0$ node.

Figure 9:
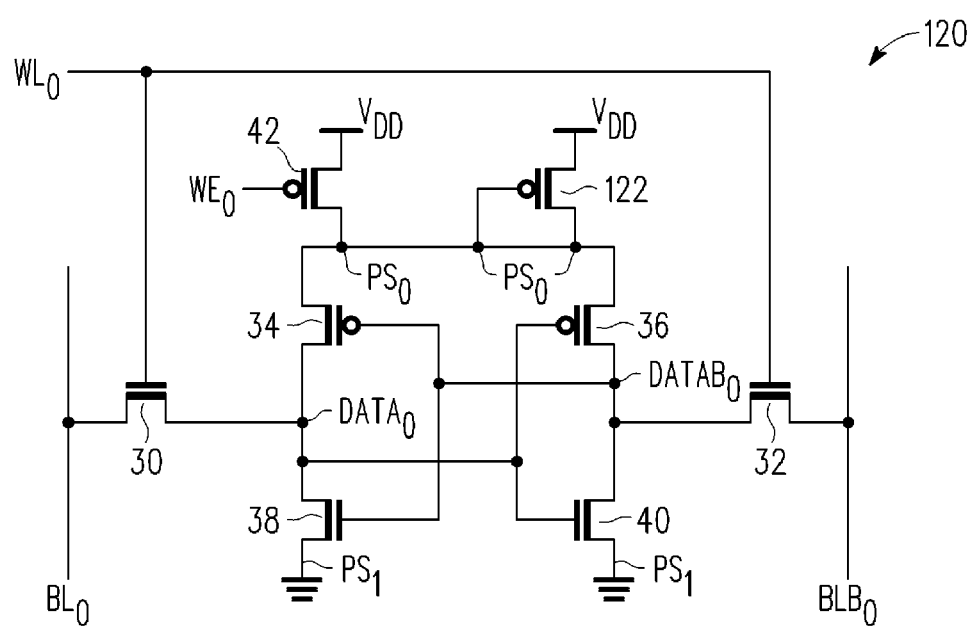
FIG. 9 shows an exemplary bitcell for an exemplary memory.

FIG. 9 shows an exemplary bitcell for an exemplary memory (for example, memory 10 or memory 50). In addition to the seven transistors shown as part of exemplary bitcell 18, exemplary bitcell 120 may include an eighth transistor 122. Transistor 122 is configured so that a V$_t$ drop from V$_{DD}$ will develop on the second power supply node (PS$_0$) when WE$_0$ is asserted. The control electrode of transistor 122 may be diode coupled to a current electrode of transistor 122, which is coupled to the second power supply node (PS$_0$). A second current electrode of transistor 122 may be coupled to the V$_{DD}$ voltage terminal. Although FIG. 9 shows a specific diode-connected transistor implementation in bitcell 98, other implementations may also be used consistent with the disclosed embodiments. For example, transistor 122 may be an n-MOS device with its gate coupled to its source, which would be coupled to the V$_{DD}$ voltage terminal, and its drain coupled to the second power supply node (PS$_0$). Since, exemplary bitcell 120 is an eight transistor version of the seven transistor implementation shown in FIG. 2. Bitcell 120 may operate in a substantially similar manner to bitcell 18. However, with the addition of diode-connected transistor 122, the second power supply node (PS$_0$) of bitcell 120 may drop to a voltage substantially equal to V$_{DD}$ minus the threshold voltage (V$_t$) of diode-connected transistor 122 when WE$_0$ is asserted. In particular, when bitcell 120 is to be written, $WE_0$ signal may be asserted resulting in the drop of the voltage at the internal node to $V_{DD}$-$V_t$. $WE_0$ signal could be pulsed on to allow bitcell 120 to restore to a logic high value on $DATA_0$ node before $WL_0$ signal falls to logic zero. Additionally, when the memory is not being read or written, the $WE_0$ signal could be asserted to all rows to reduce standby leakage. Asserting the $WE_0$ signal on all rows in the standby mode would decouple all bitcells from $V_{DD}$ so that transistor 122 in each bitcell would maintain a $V_{DD}$-$V_t$ voltage on the second power supply node to preserve bitcell state while reducing leakage. In one embodiment, the $WE_0$ signal may always be asserted and only de-asserted during a read operation to improve read margin or to increase the drive capability of a read port such as read port 79 in FIG. 5. Alternatively, the $WE_0$ signal of bitcell 120 could be tied to the $WL_0$ signal and thus delaying the restore of the logic high signal until after the fall of $WL_0$ signal to logic zero value.

Although in the foregoing specification, the invention has been described with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory, comprising:
   a first bit line;
   a second bit line;
   a first word line;
   a first pair of cross-coupled inverters having a first input/output node and a second input/output node, a first power supply node and a second power supply node, wherein the first power supply node is coupled to a first power supply terminal;
   a first gating transistor coupled between a second power supply terminal and the second power supply node, the first gating transistor receiving a first write enable signal that gates the gating transistor to a non-conductive condition during a write of the first pair of cross-coupled inverters;
   a first pass transistor coupled to the first word line, the first input/output node, and the first bit line; and
   a second pass transistor coupled to the first word line, the second input/output node, and the second bit line.

2. The memory of claim 1, further comprising a load coupled between the second power supply terminal and the second power supply node.

3. The memory of claim 2, wherein the load comprises a diode-connected transistor.

4. The memory of claim 1, wherein the first pair of cross-coupled inverters comprises;
   a first N channel transistor having a gate coupled to the first input/output node, a drain coupled to the second input/output node; and a source coupled to the first power supply terminal;
   a second N channel transistor having a gate coupled to the second input/output node, a drain coupled to the first input/output node; and a source coupled to the first power supply node;
   a first P channel transistor having a gate coupled to the first input/output node, a drain coupled to the second input/output node; and a source coupled to the second power supply node; and
   a second P channel transistor having a gate coupled to the second input/output node, a drain coupled to the first input/output node; and a source coupled to the second power supply node.

5. The memory of claim 1, wherein the gating transistor receives the first write enable signal via the word line.

6. The memory of claim 1, further comprising a first write enable line for carrying the first write enable signal coupled to the first gating transistor.

7. The memory of claim 6, further comprising a first signal generator coupled to the first write enable line for generating the first write enable signal.

8. The memory of claim 6, further comprising:
   a third bit line;
   a fourth bit line;
   a second pair of cross-coupled inverters having a first input/output node and a second input/output node, a first power supply node and a second power supply node, wherein the first power supply node is coupled to the first power supply terminal;
   a second gating transistor coupled between the second power supply terminal and the second power supply node of the second pair of cross-coupled inverters;
   a third pass transistor coupled to the first word line, the first input/output node of the second pair of cross-coupled inverters, and the third bit line;
   a fourth pass transistor coupled to the first word line, the second input/output node of the second pair of cross-coupled inverters, and the fourth bit line;
   a third gating transistor coupled between the second power supply node of the first pair of cross-coupled inverters and the second power supply terminal;
   a first column select line substantially parallel to the first, second, third, and fourth bit lines that is coupled to the third gating transistor;
   a fourth gating transistor coupled between the second power supply node of the second pair of cross-coupled inverters and the second power supply terminal; and
   a second column select line substantially parallel to the first, second, third, and fourth bit lines that is coupled to the fourth gating transistor;
   wherein the first and third gating transistors are gated to a non-conductive condition during a write of the first pair of cross-coupled inverters, and the second and fourth gating transistors are gated to a non-conductive condition during a write of the second pair of cross-coupled inverters.

9. The memory of claim 6, further comprising:
   a second word line;
   a second pair of cross-coupled inverters having a first input/output node and a second input/output node, a first power supply node and a second power supply node, wherein the first power supply node is coupled to the first power supply terminal;

a second gating transistor coupled between the second power supply terminal and the second power supply node of the second pair of cross-coupled inverters;

a third pass transistor coupled to the second word line, the first input/output node of the second pair of cross-coupled inverters, and the first bit line;

a fourth pass transistor coupled to the second word line, the second input/output node of the second pair of cross-coupled inverters, and the second bit line;

a third gating transistor coupled between the second power supply node of the first pair of cross-coupled inverters and the second power supply terminal;

a fourth gating transistor coupled between the second power supply node of the second pair of cross-coupled inverters and the second power supply terminal; and a first column select line substantially parallel to the first and second bit lines that is coupled to the third gating transistor and the fourth gating transistor;

wherein the first column select line gates the third gating transistor to a non-conductive condition during a write of the first pair of cross-coupled inverters, and gates the fourth gating transistor to a non-conductive condition during a write of the second pair of cross-coupled inverters.

10. The memory of claim 9, further comprising:

a third bit line;

a fourth bit line;

a third pair of cross-coupled inverters having a first input/output node and a second input/output node, a first power supply node and a second power supply node, wherein the first power supply node is coupled to the first power supply terminal;

a fifth gating transistor coupled between the second power supply terminal and the second power supply node of the third pair of cross-coupled inverters;

a sixth gating transistor coupled between the second power supply terminal and the second power supply node of the third pair of cross-coupled inverters;

a fifth pass transistor coupled to the first word line, the first input/output node of the third pair of cross-coupled inverters, and the third bit line;

a sixth pass transistor coupled to the first word line, the second input/output node of the third pair of cross-coupled inverters, and the fourth bit line;

a second column select line substantially parallel to the first, second, third, and fourth bit lines that is coupled to the sixth gating transistor;

wherein the fifth and sixth gating transistors are gated to a non-conductive condition during a write of the third pair of cross-coupled inverters.

11. The memory of claim 1, further comprising:

a third bit line;

a fourth bit line;

a second word line;

a third pass transistor coupled to the second word line, the first input/output node, and the third bit line; and a fourth pass transistor coupled to the second word line, the second input/output node, and fourth bit line.

12. In a memory comprising a first pair of cross-coupled inverters, a first pair of bit lines, a first pair of pass gates coupled between the first pair of bit lines and the first pair of cross-coupled inverters, and a first word line coupled to the first pair of pass gates, a method comprising:

applying a power supply voltage to the first pair of cross-coupled inverters to retain data in the first pair of cross-coupled inverters;

enabling the first word line during writing of the first pair of cross-coupled inverters;

applying data to the first pair of bit lines during writing of the first pair of cross-coupled inverters; and selectively decoupling the power supply voltage from the first pair of cross-coupled inverters during writing of the first pair of cross-coupled inverters.

13. The method of claim 12, further comprising:

disabling the first word line to terminate writing of the first pair of cross-coupled inverters; and restoring the power supply voltage to the first pair of cross-coupled inverters prior to the step of disabling the first word line.

14. In the method of claim 12, wherein the memory further comprises a second word line, a second pair of bit lines, and a second pair of pass transistors coupled to the second word lines and between the second pair of bit lines and the first pair of cross-coupled inverters, the method further comprising:

enabling the second word line during writing of the first pair of cross-coupled inverters;

applying data to the second pair of bit lines during writing of the first pair of cross-coupled inverters; and decoupling the power supply voltage from the first pair of cross-coupled inverters during the steps of enabling the second word line and applying data to the second pair of bit lines.

15. The method of claim 12, wherein the step of decoupling is further characterized as retaining a different voltage from the power supply voltage to the first pair of cross-coupled inverters.

16. In the method of claim 12, wherein the memory further comprises a second pair of cross-coupled inverters, a second pair of bit lines, a second pair of pass transistors that are coupled to the first word line and between the second pair of bit lines and the second pair of cross-coupled inverters, the method further comprising:

applying a power supply voltage to the second pair of cross-coupled inverters to retain data in the second pair of cross-coupled inverters;

enabling the first word line during writing of the second pair of cross-coupled inverters;

applying data to the second pair of bit lines during writing of the second pair of cross-coupled inverters;

decoupling the power supply voltage from the second pair of cross-coupled inverters during writing of the second pair of cross-coupled inverters; and retaining applying the power supply voltage to the first pair of cross-coupled inverters throughout the writing of the second pair of cross-coupled inverters.

17. In the method of claim 12, wherein the memory further comprises a second pair of cross-coupled inverters, a second word line, a second pair of pass transistors that are coupled to the second word line and between the first pair of bit lines and the second pair of cross-coupled inverters, the method further comprising:

applying a power supply voltage to the second pair of cross-coupled inverters to retain data in the second pair of cross-coupled inverters;

enabling the second word line during writing of the second pair of cross-coupled inverters;

applying data to the first pair of bit lines during writing of the second pair of cross-coupled inverters;

decoupling the power supply voltage from the second pair of cross-coupled inverters during writing of the second pair of cross-coupled inverters; and retaining applying the power supply voltage to the first pair of cross-coupled inverters throughout the writing of the second pair of cross-coupled inverters.

18. The method of claim 16, wherein enabling the first word line during writing of the first pair of cross-coupled inverters comprises processing at least two different write enable signals.

19. A memory, comprising:

a word line;

a plurality of memory cells coupled to the word line;

a plurality of pairs of bit lines, wherein each memory cell of the plurality of memory cells is coupled to a different pair of bit lines of the plurality of bit lines;

power means for coupling power to the memory cells for retaining states of the memory cells and decoupling power from the plurality of memory cells during a write of the plurality of memory cells.

20. The memory of claim 19, wherein the power means comprises:

a plurality of gating transistors, wherein each memory cell of the plurality of memory cells has coupled thereto a different one of the gating transistors of the plurality of gating transistors;

a signal generator for generating a write enable signal; and a write enable line coupled to the signal generator and the plurality of gating transistors.

21. A memory, comprising:

a first bit line;

a second bit line;

a first word line;

a first pair of cross-coupled inverters having a first input/output node and a second input/output node, a first power supply node and a second power supply node, wherein the first power supply node is coupled to a first power supply terminal;

a first gating transistor coupled between a second power supply terminal and the second power supply node, the first gating transistor being non-conductive in response to a control signal;

a first pass transistor coupled to the first word line, the first input/output node, and the first bit line; and a second pass transistor coupled to the first word line, the second input/output node, and the second bit line.

22. The memory of claim 21, wherein the control signal is used during a write operation.

23. The memory of claim 21, wherein the control signal is used during a standby operation.

24. The memory of claim 21, wherein the control signal is coupled to the first word line.

25. The memory of claim 23, wherein during the standby operation the control signal is used to decouple the first power supply node from the first power supply terminal.

* * * * *